(12) United States Patent
Holst

(10) Patent No.: US 6,491,357 B2
(45) Date of Patent: Dec. 10, 2002

(54) METHOD FOR COMMUNICATING A WHEEL SPEED SENSOR FAULT IN A VEHICLE ANTI-LOCK BRAKING SYSTEM

(75) Inventor: Hans Holst, Velber (DE)

(73) Assignee: Wabco GmbH & Co. oHG, Hannover (DE)

(*) Notice: Subject to any disclaimer, the term of this patent is extended or adjusted under 35 U.S.C. 154(b) by 0 days.

(21) Appl. No.: 10/055,057

(22) Filed: Jan. 22, 2002

(65) Prior Publication Data

US 2002/0101115 A1 Aug. 1, 2002

(30) Foreign Application Priority Data

Jan. 30, 2001 (DE) .......................... 101 03 853

(51) Int. Cl.⁷ ................................. B60T 8/88
(52) U.S. Cl. ................................. 303/122.03
(58) Field of Search .......................... 303/122, 122.02, 303/122.03, 122.04, 122.05, 122.06; 73/118.1, 129; 340/441, 523; 324/160

(56) References Cited

U.S. PATENT DOCUMENTS 3,680,923 A * 8/1972 Peterson et al. ............... 303/20
5,265,468 A * 11/1993 Holst .......................... 73/118.1
5,923,163 A * 7/1999 Stuible et al. ............... 324/160
6,133,827 A * 10/2000 Alvey et al. ................. 340/438
6,170,923 B1 1/2001 Iguchi et al.
6,272,407 B1 * 8/2001 Scholl .......................... 701/29

FOREIGN PATENT DOCUMENTS

| DE | 32 29 207 C2 | 1/1987 |
| DE | 38 30 278 A1 | 3/1989 |
| DE | 41 06 704 A1 | 9/1992 |
| DE | 43 10 530 A1 | 10/1994 |
| DE | 196 22 462 A1 | 12/1997 |
| DE | 36 28 585 C2 | 4/1998 |

* cited by examiner

Primary Examiner—Christopher P. Schwartz
(74) Attorney, Agent, or Firm—Kramer Levin Naftalis & Frankel LLP

(57) ABSTRACT

A method for communicating a wheel speed sensor fault in an anti-lock braking system (ABS) for a road vehicle, especially for an ABS with voltage supply controlled by the brake light switch, is provided. If, during monitoring of the wheel speed sensors, a sensor fault is detected in at least one of the sensors, a warning light is actuated and a sensor fault bit is set in the ABS fault memory. The already lighted warning light is turned off and the sensor fault bit is deleted only when the wheel speed sensor in question delivers, at a predefined (low) vehicle limit speed, a voltage signal having an amplitude greater than a predefined voltage threshold.

9 Claims, 3 Drawing Sheets

METHOD FOR COMMUNICATING A WHEEL SPEED SENSOR FAULT IN A VEHICLE ANTI-LOCK BRAKING SYSTEM

BACKGROUND OF THE INVENTION

The present invention is directed generally to an improved method for communicating a wheel speed sensor fault in an anti-lock braking system (ABS) for a road vehicle having a warning light.

Warning light activation in an ABS is generally described in German Patent A1 4106704. In such prior art, the ABS fault lamp or warning light turns on when the vehicle ignition is turned on. Thereupon, the wiring of the ABS and other hardware are tested. If this test does not detect any faults, the fault lamp goes out, otherwise it remains on and the fault is stored in a fault memory of the ABS.

Thereafter, while the vehicle is moving, i.e., when the vehicle speed is greater than a limit speed, the wheel speed sensors are checked for correct function and voltage output. If this check does not detect any faults, the fault lamp remains off. If a fault is detected, however, the light goes on again and the fault is stored in a fault memory of the ABS. The same procedure takes place for other faults recognized during driving, including hardware faults and loose contacts.

If an old sensor fault, i.e., a fault from a previous operating cycle, is still stored in the ABS electronics when the vehicle is started, the fault lamp remains on after the wiring test. Now, the result of the actual sensor test conducted when the vehicle is being driven is awaited. If, now, the sensor in question is recognized to be fault free on this occasion, the fault lamp goes out and the fault memory in question is cleared.

The prior art ABS described above is commonly available in two versions as regards its voltage supply.

In one version, the voltage supply is turned on and off with the ignition switch of the vehicle. In this case, the ABS is functional during the entire operating time of the vehicle (permanent supply).

In the other version, the brake light switch of the vehicle controls (directly or indirectly) the voltage supply. In this case, the ABS is in operation only when the driver has depressed the brake pedal, whereupon the ABS performs its function of monitoring and, if necessary, regulating the braking action.

Anti-lock braking systems of the latter version therefore have much smaller current consumption. Indeed, they do not consume any current while the vehicle is stationary with the ignition turned on. Moreover, if such systems are disposed in trailers, they do not need their own power supply lines from the towing vehicles. However, fault recognition in such systems with brake light supply is more difficult, especially for the wheel speed sensors, since they are energized only briefly, namely during braking, and it is only then that they are able to be tested for faults.

SUMMARY OF THE INVENTION

Generally speaking, in accordance with the present invention, an improved method for communicating a wheel speed sensor fault in a vehicle ABS is provided which overcomes disadvantages associated with prior art methods.

The method according to the present invention is carried out in a conventional vehicle ABS (including in an ABS in which voltage supply is controlled by the brake light switch) having wheel speed sensors for monitoring the speed of the vehicle wheels, a warning light and a fault memory for storing sensor fault bits. In such an ABS, the warning light is actuated and a sensor fault bit is set in fault memory when a wheel speed sensor is recognized as faulty with respect to its voltage signal. The warning light is deactivated and the fault bit is deleted from memory when the wheel speed sensor has been recognized as fault free.

The method according to the present invention improves over such conventional systems by deactivating the warning light and deleting the associated fault bit from fault memory when the voltage signal previously recognized as faulty is higher than a predefined voltage threshold when the vehicle is moving at a predefined low limit speed.

Accordingly, it is an object of the present invention to provide a method for communicating a wheel speed sensor fault in an ABS, and for checking the function of the wheel speed sensors in the ABS, whereby a fault of a wheel speed sensor will be accurately signaled to the driver of the vehicle.

Still other objects and advantages of the present invention will in part be obvious and will in part be apparent from the specification.

The present invention accordingly comprises the several steps and the relation of one or more of such steps with respect to each of the others, and embodies features of construction, combination of elements, and arrangement of parts which are adapted to effect such steps, all as exemplified in the detailed disclosure hereinafter set forth, and the scope of the invention will be indicated in the claims.

BRIEF DESCRIPTION OF THE DRAWINGS

For a fuller understanding of the invention, reference is had to the following description taken in connection with the accompanying drawings in which.

DETAILED DESCRIPTION OF THE PREFERRED EMBODIMENTS

Figure 1:
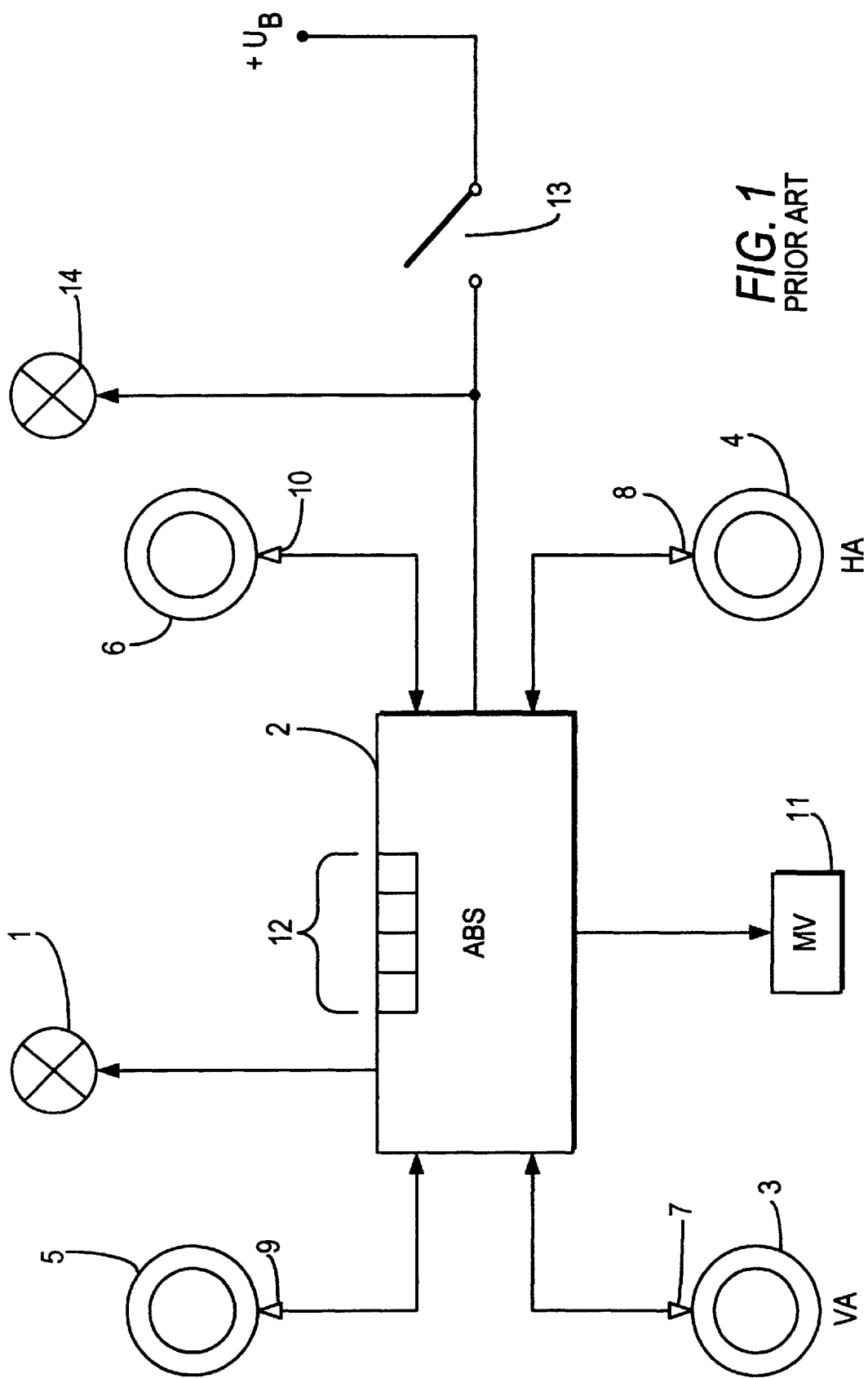
FIG. 1 is a schematic diagram of an ABS with brake light voltage supply according to the prior art.

Referring to the drawing figures where like reference numerals are used for corresponding elements, FIG. 1 shows a simplified schematic diagram of a conventional ABS 2 for a two-axle vehicle with front axle VA and rear axle HA, the system being supplied with operating voltage $U_B$ via a brake light switch 13. The vehicle may be a towing vehicle or a trailer. Brake light switch 13 is connected in known manner to the brake pedal of the towing vehicle (not illustrated) and functions to activate brake lights 14.

ABS 2 receives speed signals for wheels 3, 4, 5 and 6 from wheel speed sensors 7, 8, 9 and 10, respectively, mounted on the wheels. Wheel speed is monitored in known manner by ABS 2 and, in the event of locking tendency, the brake pressure initially applied by the vehicle driver is regulated or lowered if necessary by means of solenoid valves (MV) 11.

ABS 2 contains additional circuit elements used for monitoring wheel speed sensors 7, 8, 9 and 10. If a speed sensor has been recognized to be faulty, an ABS warning light 1 is activated and the fault (sensor fault bit) is stored in a fault memory 12. This contains a separate memory area for each of the four wheels. Thus, it is possible to localize the faulty sensor during repairs.

Wheel speed sensors 7, 8, 9 and 10 may be inductive sensors which face a toothed ring disposed on the wheel (see, e.g., German Patent A1 3628585). Such passive sensors deliver a speed signal whose frequency is proportional to the wheel speed and whose amplitude is also proportional to the wheel speed and also approximately inversely proportional to the distance (air gap) between the sensor and the toothed ring. It should be understood, however, that other sensors, such as, for example, Hall effect sensors, may also be utilized.

Hereinafter, the term "sensor" is to be understood as the combination of sensor and pole wheel or toothed ring.

Figure 2A:
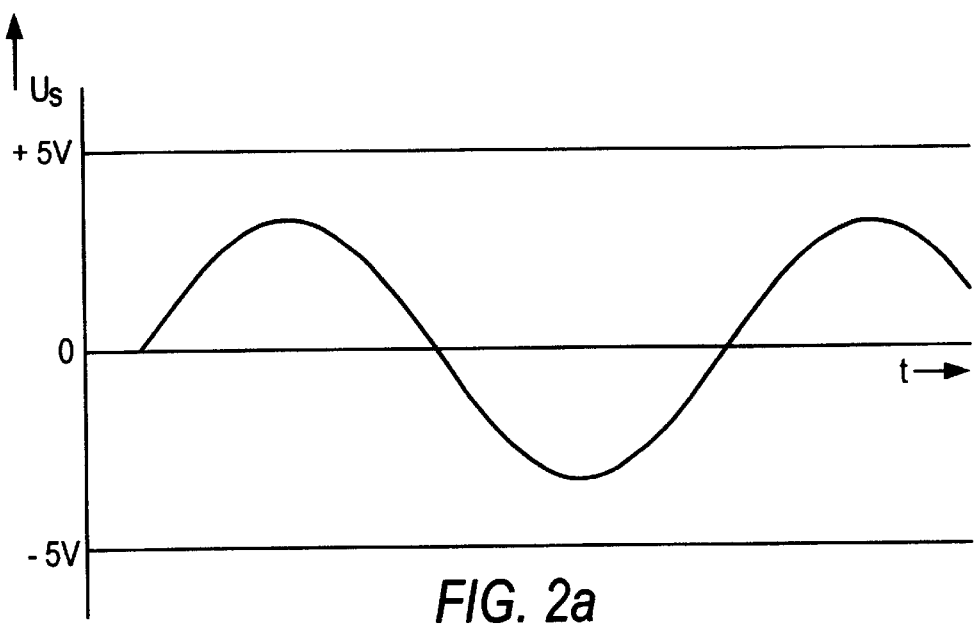
FIG. 2*a* is a graphical representation of a wheel speed sensor signal below the response threshold of the ABS according to the prior art.

A wheel speed sensor signal delivered by such a combination is illustrated in FIG. 2a. This signal has such a small amplitude, however, that it does not reach the internal voltage threshold of the ABS electronics, which in this case is, for example, ±5 V. The voltage threshold is necessary to ensure that the electronics can distinguish the signal of the wheel speed sensor from interference voltages. For this reason, the electronics of ABS 2 recognize the speed signal of FIG. 2a either as "zero speed" or as "no speed signal present."

Figure 2B:
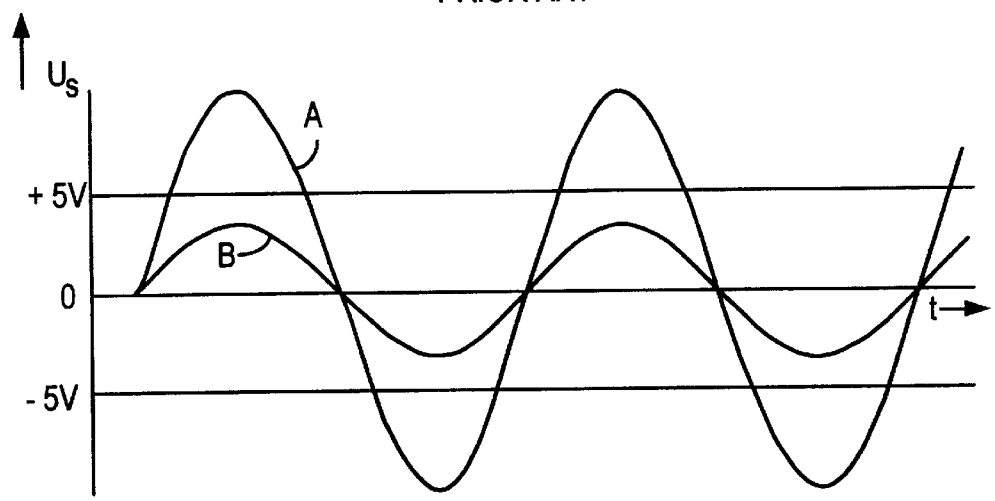
FIG. 2*b* is a graphical representation of a wheel speed sensor signal above the response threshold of the ABS according to the prior art.

FIG. 2b illustrates the output signal of the same sensor for a higher wheel speed. Signal A of the undisturbed sensor has a higher frequency and an amplitude that exceeds the voltage limit of ±5 V. It is therefore recognized as wheel speed. The electronics of ABS 2 analyze the frequency of the signal and convert it to wheel speed.

FIG. 2b shows a further voltage curve B which was generated at the same wheel speed but by a malfunctioning sensor. The malfunction in this case results from the fact that the distance (air gap) between the toothed ring and the sensor is inadmissibly large. For this reason the voltage output of the sensor is so low that the aforesaid threshold is not reached. As in the case of FIG. 2a, here, a distinct wheel speed cannot be recognized by the ABS electronics. The sensor is therefore recognized as faulty.

The wheel speed sensor is typically mounted to the chassis of the vehicle by means of a sensor clamping bush (see, e.g., German Patent A1 3229207), and thus can be displaced. As an example, the wheel sensor can be pushed back by extreme loads on the vehicle axle or by foreign matter that has penetrated between the toothed ring and the sensor, thus leading to an air gap that is too large and, in turn, to a malfunction, as illustrated in curve B of FIG. 2b.

Figure 3:
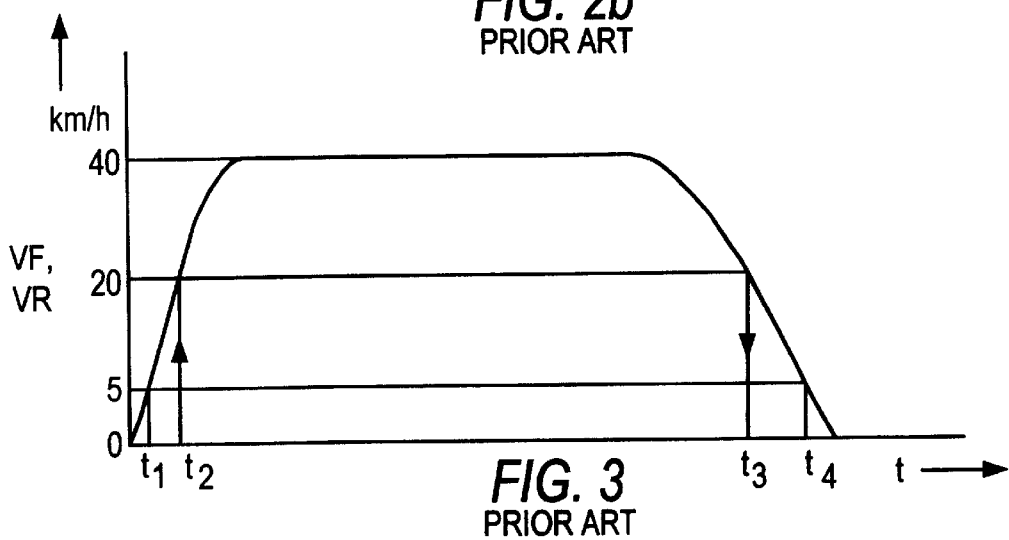
FIG. 3 is a graphical representation of a wheel speed signal formed in the ABS for both a fault-free sensor and a malfunctioning sensor according to the prior art.

FIG. 3 illustrates wheel speed signals that have been generated within the ABS, in one case for a fault-free sensor, and in the other for a malfunctioning sensor.

Referring to FIG. 3, in the fault-free case, the sinusoidal sensor signal exceeds, at time $t_1$, the ±5 V threshold, which corresponds to a vehicle speed $V_F$ of 5 km/h. Starting from time $t_1$, therefore, the ABS electronics receive a correct speed signal. A correct speed signal is received as the vehicle accelerates to 40 km/h. After a distance has been driven at constant speed, the vehicle is braked. At time $t_4$ the amplitude of the sensor signal drops below the ±5 V threshold, and from that point on a speed signal is no longer present.

In the malfunctioning case, i.e., for a sensor with an inadmissibly large air gap, the amplitude of the sensor signal does not exceed the ±5 V threshold until time $t_2$, whereupon it is recognized by the ABS electronics as a speed signal. The ABS electronics then calculate, from the frequency of the sensor signal, a wheel speed which in FIG. 3 is 20 km/h. The sudden increase in wheel speed from 0 to 20 km/h at $t_2$ is, not physically possible, and is recognized by the electronics as a jump in speed. A fault bit for the sensor in question is stored in fault memory 12. Proper ABS regulation for this wheel is therefore not possible in the range from 0 to 20 km/h. An analogous process takes place at time $t_3$, where the wheel speed apparently drops abruptly from 20 km/h to 0. Such an inadmissible response is also stored as a fault in fault memory 12.

Figure 4:
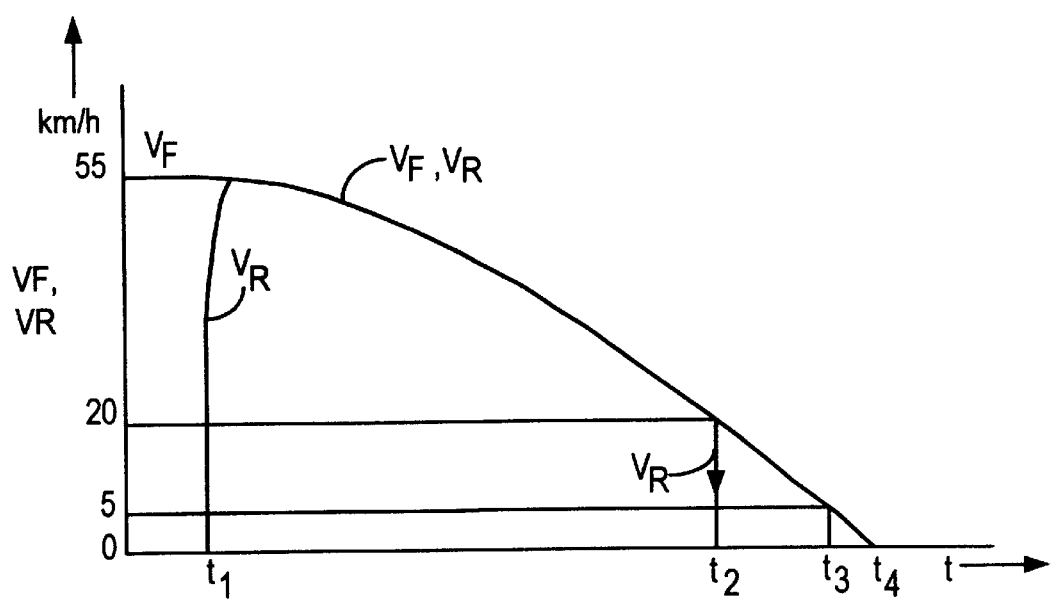
FIG. 4 is a graphical representation of a wheel speed signal of an ABS with brake light voltage supply during a typical vehicle braking action according to, the prior art.

FIG. 4 illustrates how the speed of a vehicle ($V_F$=vehicle speed, $V_R$=wheel speed) equipped with an ABS with a brake light voltage supply varies with time during a typical braking process.

During the period from 0 to $t_1$, the vehicle moves at a constant speed $V_F$, which in FIG. 4 is 55 km/h. At time $t_1$, the vehicle driver applies the brake, and, simultaneously, the ABS is supplied with its operating voltage $U_B$ via brake light switch 13, thus internally generating a wheel speed $V_R$, which in this case correctly jumps from 0 to the vehicle speed $V_F$. Thereafter, the vehicle is continuously braked until it comes to a stop at time $t_4$.

Figure 5A:
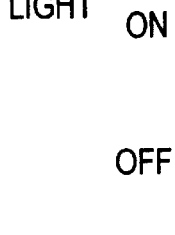
FIG. 5*a* is a timing diagram showing warning light activation according to the prior art in the case of a faulty sensor in an ABS with brake light voltage. supply during vehicle braking as shown in FIG. 4.

FIG. 5a illustrates, relative to FIG. 4, activation of the ABS warning light according to the prior art. In this connection, it is initially assumed that the sensor delivering the wheel speed signal $V_R$ is malfunctioning in the manner illustrated in curve B of FIG. 2b, which means that its air gap is too large. The sensor malfunctioning in this way therefore generates in the ABS electronics apparent speed jumps at a vehicle speed of 20 km/h. From 0 to $t_1$ the warning. light is off, since it is also supplied via brake light switch 13. At time $t_1$, the warning light turns on until time $t_1'$ in order to indicate the ABS function to the driver. Thereafter, however, it goes off, and thus the wheel sensor is not recognized as still malfunctioning, since the malfunctioning sensor delivers a signal when the vehicle speed is above 20 km/h.

Starting from time $t_2$, the electronics then recognize an abrupt drop in wheel speed, which is stored as a fault and indicated by warning light 1 (ON). Thereafter the content of corresponding fault memory 12 is saved even if the operating voltage is turned off. Starting from time $t_5$ the light goes out, since at this point the driver releases the brake.

Figure 5B:
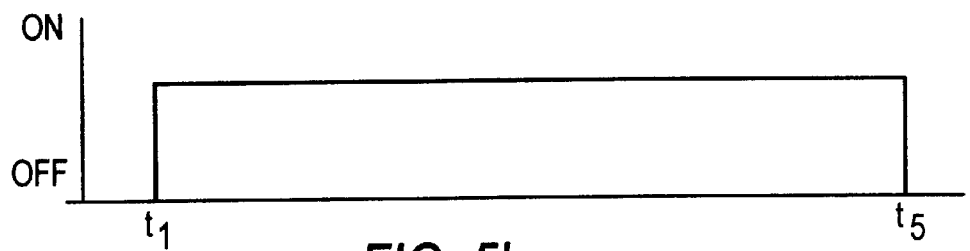
FIG. 5*b* is a timing diagram showing warning light activation according to the method of the present invention in the case of a faulty sensor in an ABS with brake light voltage supply during vehicle braking as shown in FIG. 4.

FIG. 5b illustrates, relative to FIG. 4, warning light activation according to the method of the present invention with the same sensor that is faulty. Warning light 1 remains on during the entire braking action—in this case, warning light 1 turns off and the fault bit in the fault memory is deleted only when the wheel speed sensor previously recognized as faulty delivers, at a predefined (low) vehicle limit speed (such as 5 km/h), a speed signal whose amplitude is larger than a predefined voltage threshold (such as 5 V). The malfunctioning sensor does not do this, however, since at time $t_3$, where the vehicle is moving at the predefined low limit speed (5 km/h in this case), a sensor signal is no longer sensed.

Figure 5C:
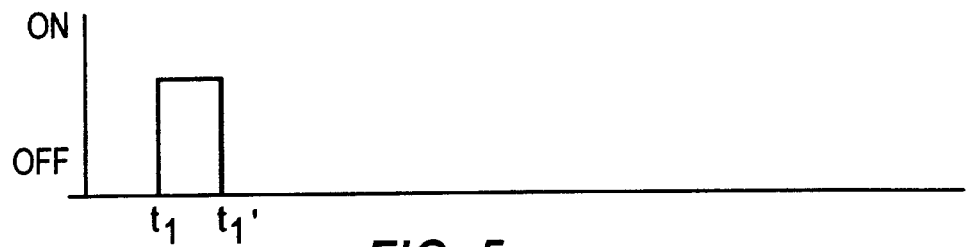
FIG. 5*c* is a timing diagram showing warning light activation according to the method of the present invention in the case of a fault-free sensor in an ABS with brake light voltage supply during vehicle braking as shown in FIG. 4.

FIG. 5c illustrates, relative to FIG. 4, warning light activation according to the method of the present invention with a sensor that is fault free. As is evident from FIG. 5c, the warning light for providing the driver with information is activated from time $t_1$ until time $t_1'$.

The present inventor has found, through experimentation, that the predefined low vehicle limit speed is preferably lower than 20 km/h. Likewise, the predefined voltage threshold is preferably lower than 15 V.

It should be appreciated that it may be advantageous to store a fault bit specifically for each sensed wheel, or only for each sensed axle, for each side of the vehicle or for the entire vehicle.

The method according to the present invention offers a particular advantage for initial operation of the ABS on the assembly line or in a shop. In this connection, all sensor fault bits are first set at the factory in fault memory 12 of the ABS electronics. Initial operation is then achieved by turning the wheels individually by hand while the vehicle is raised on blocks. If the ABS electronics recognize a corresponding sensor signal under these conditions, the sensor fault bit of the wheel being turned is deleted.

In the prior art, the sensor fault bit is deleted in each case merely if the wheel has been turned rapidly enough. Under these conditions, sensors whose air gaps are too large are also regarded as fault free.

This does not occur with the method according to the present invention, since a fault-free sensor or a fault-free sensor signal is recognized only if a sufficiently large sensor amplitude has already been recognized at a low wheel speed or vehicle speed. Thus, the sensor fault bit initially stored at the factory cannot be deleted by turning the wheel rapidly. On the contrary, the sensor recognized as faulty by the ABS electronics must be inspected, and its distance from the pole wheel (air gap) must be decreased manually to the correct size if necessary.

The method according to the present invention has a further advantage in that, because the warning light is on, the driver is made aware of a defective sensor (or of a defective pole wheel) also during a braking action (from $t_1'$ to $t_2$ in FIG. 5a), and so can alter his driving pattern accordingly.

It should be appreciated that the method according to the present invention may be employed not only for two-axle vehicles but also for other multi-axle vehicles or single-axle vehicles (trailers).

It will thus be seen that the objects set forth above, among those made apparent from the preceding description, are efficiently attained and, since certain changes may be made in carrying out the above method and in the constructions set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. In a vehicle anti-lock braking system having wheel speed sensors for generating voltage signals representing the speed of the vehicle wheels, a warning light and a fault memory for storing at least one sensor fault bit, wherein said warning light is actuated and said at least one sensor fault bit is set in said fault memory when at least one of said wheel speed sensors is recognized as faulty with respect to its voltage signal, a method for communicating a wheel speed sensor fault comprising the steps of: deactivating said warning light and deleting said at least one sensor fault bit from said fault memory when a wheel speed sensor voltage signal previously recognized as faulty has an amplitude larger than a predefined voltage threshold when the vehicle is moving at a predefined low limit speed.

2. The method according to claim 1, wherein said anti-lock braking system has a voltage supply controlled by a brake light switch of said vehicle.

3. The method according to claim 1, wherein the predefined low vehicle limit speed is less than 20 km/h.

4. The method according to claim 1, wherein the predefined voltage threshold is less than 15 V.

5. The method according to claim 1, wherein a separate sensor fault bit is stored in said fault memory for each of said wheels of said vehicle.

6. The method according to claim 1, wherein a separate sensor fault bit is stored in said fault memory for a front axle of said vehicle.

7. The method according to claim 1, wherein a separate sensor fault bit is stored in said fault memory for a rear axle of said vehicle.

8. The method according to claim 1, wherein a separate sensor fault bit is stored in said fault memory for each side of said vehicle.

9. The method according to claim 1, wherein only one sensor fault bit can be stored in said fault memory for said vehicle as a whole.

* * * * *